(12) United States Patent
Yen et al.

(10) Patent No.: US 11,462,484 B2
(45) Date of Patent: Oct. 4, 2022

(54) ELECTRONIC PACKAGE WITH WETTABLE FLANK AND SHIELDING LAYER AND MANUFACTURING METHOD THEREOF

(71) Applicant: Advanced Semiconductor Engineering, Inc., Kaohsiung (TW)

(72) Inventors: You-Lung Yen, Kaohsiung (TW); Bernd Karl Appelt, Kaohsiung (TW); Kay Stephan Essig, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/066,408

(22) Filed: Oct. 8, 2020

(65) Prior Publication Data

US 2022/0115328 A1   Apr. 14, 2022

(51) Int. Cl.
| | |
|---|---|
| *H01L 23/552* | (2006.01) |
| *H01L 21/48* | (2006.01) |
| *H01L 23/00* | (2006.01) |
| *H01L 23/31* | (2006.01) |
| *H01L 21/56* | (2006.01) |
| *H01L 23/498* | (2006.01) |

(52) U.S. Cl.
CPC ........ *H01L 23/552* (2013.01); *H01L 21/4846* (2013.01); *H01L 21/565* (2013.01); *H01L 23/3121* (2013.01); *H01L 23/49805* (2013.01); *H01L 24/16* (2013.01); *H01L 24/48* (2013.01); *H01L 2224/16225* (2013.01); *H01L 2224/48225* (2013.01); *H01L 2924/3025* (2013.01)

(58) Field of Classification Search
CPC . H01L 23/552; H01L 21/4846; H01L 21/565; H01L 23/3121; H01L 23/49805; H01L 24/16; H01L 24/48; H01L 2224/16225; H01L 2224/48225; H01L 2924/3025
USPC ......................................................... 257/659
See application file for complete search history.

(56) References Cited

U.S. PATENT DOCUMENTS

| | | | |
|---|---|---|---|
| 10,181,458 B2 | 1/2019 | Shih et al. | |
| 2017/0040304 A1* | 2/2017 | Shih | ............... H01L 23/552 |
| 2017/0338170 A1* | 11/2017 | Ziglioli | ................. H01L 21/78 |
| 2019/0279941 A1* | 9/2019 | Yang | ............... H01L 23/49558 |
| 2019/0318938 A1 | 10/2019 | Liu | |
| 2020/0395272 A1* | 12/2020 | Bang | ............... H01L 23/49861 |
| 2021/0193587 A1* | 6/2021 | Yada | ................... H01L 21/768 |

* cited by examiner

*Primary Examiner* — Didarul A Mazumder
(74) *Attorney, Agent, or Firm* — Foley & Lardner LLP

(57) ABSTRACT

An electronic package and manufacturing method thereof are provided. The electronic package includes a substrate, a first encapsulant, a wettable flank and a shielding layer. The substrate includes a first surface, a second surface opposite to the first surface and a side surface connecting the first surface and the second surface. The first encapsulant is disposed on the first surface of the substrate. The wettable flank is exposed from the side surface of the substrate. The shielding layer covers a side surface of the first encapsulant, wherein on the side surface of the substrate, the shielding layer is spaced apart from the wettable flank.

13 Claims, 20 Drawing Sheets

ELECTRONIC PACKAGE WITH WETTABLE FLANK AND SHIELDING LAYER AND MANUFACTURING METHOD THEREOF

BACKGROUND

1. Technical Field

The present disclosure relates to an electronic package and manufacturing method thereof, and more particularly, to an electronic package with wettable flank and shielding layer and manufacturing method thereof.

2. Description of the Related Art

With the advances in high-speed microprocessor design and the increasing capabilities of high-speed networking, electromagnetic interference (EMI) becomes a serious issue to be addressed. Reliability of electrical connection between substrate and printed circuit board (PCB) is also an issue to be solved, particular in some certain application such as automotive component. It is therefore desirable to develop an electronic package with high EMI shielding ability and high reliability.

SUMMARY

One aspect of the present disclosure relates to an electronic package. In some embodiments, the electronic package includes a substrate, a first encapsulant, a wettable flank and a shielding layer. The substrate includes a first surface, a second surface opposite to the first surface and a side surface connecting the first surface and the second surface. The first encapsulant is disposed on the first surface of the substrate. The wettable flank is exposed from the side surface of the substrate. The shielding layer covers a side surface of the first encapsulant, wherein on the side surface of the substrate, the shielding layer is spaced apart from the wettable flank.

Another one aspect of the present disclosure relates to an electronic package. In some embodiments, the electronic package includes a substrate, a first encapsulant, a second encapsulant, a wettable flank and a shielding layer. The substrate includes a first surface, a second surface opposite to the first surface and a side surface connecting the first surface and the second surface. The first encapsulant is disposed on the first surface of the substrate. The second encapsulant is disposed on the second surface of the substrate. A side surface of the wettable flank is exposed from a side surface of the second encapsulant. The shielding layer covers a side surface of the first encapsulant and at least a portion of the side surface of the substrate, wherein the shielding layer and the wettable flank are separated by the side surface of the second encapsulant.

Another aspect of the present disclosure relates to a method of manufacturing an electronic package. In some embodiments, the method includes the following operations. A substrate is provided. A first encapsulant is formed on a first surface of the substrate, and a plurality of wettable flanks are formed on a second surface of the substrate. A first pre-cut process is performed to form a trench in the first encapsulant exposing a side surface of the first encapsulant, wherein a bottom of the trench is distant from the wettable flanks. A first shielding layer is formed to cover the side surface of the first encapsulant.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
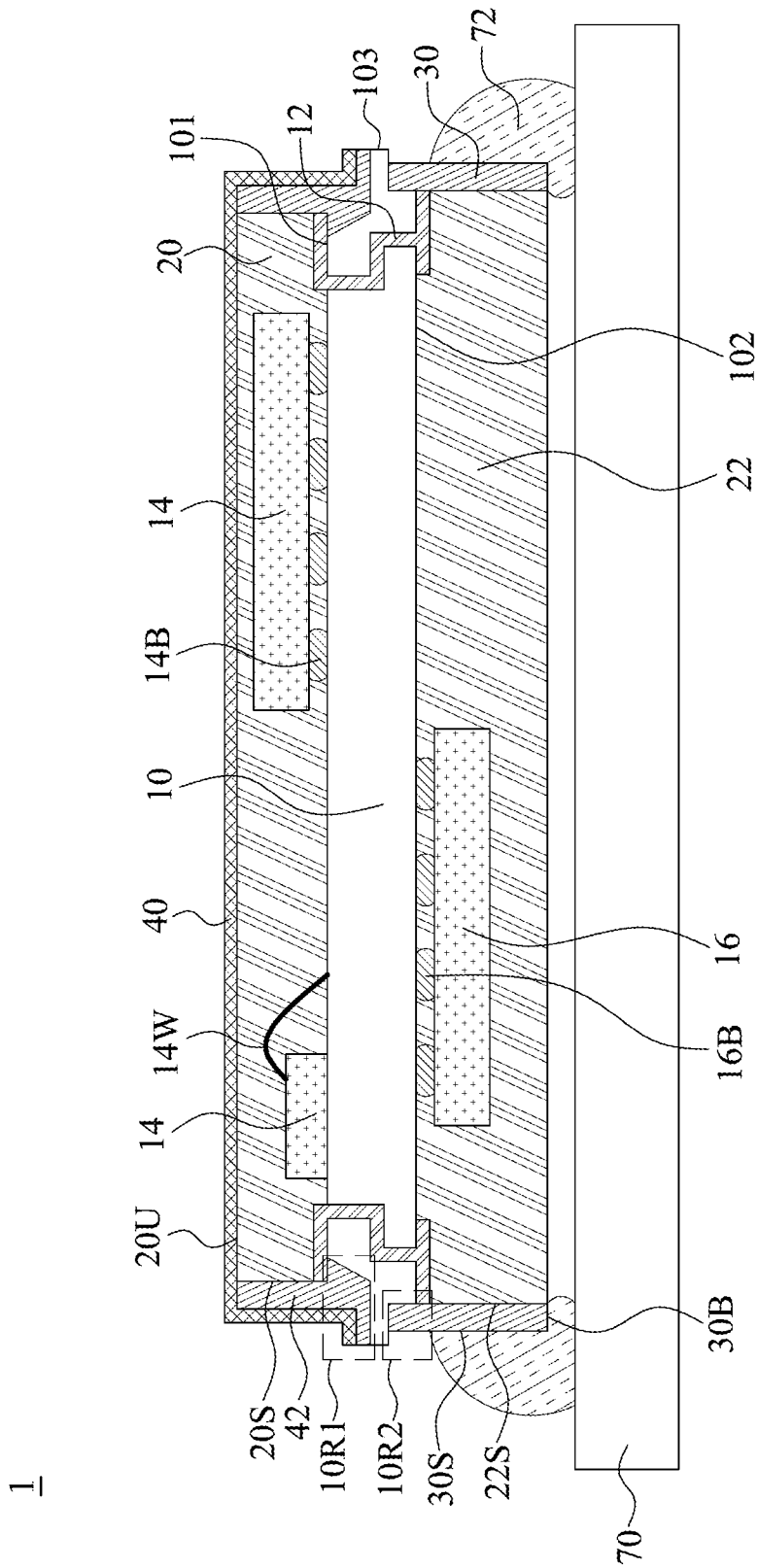
FIG. 1 is a schematic cross-sectional view of an electronic package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
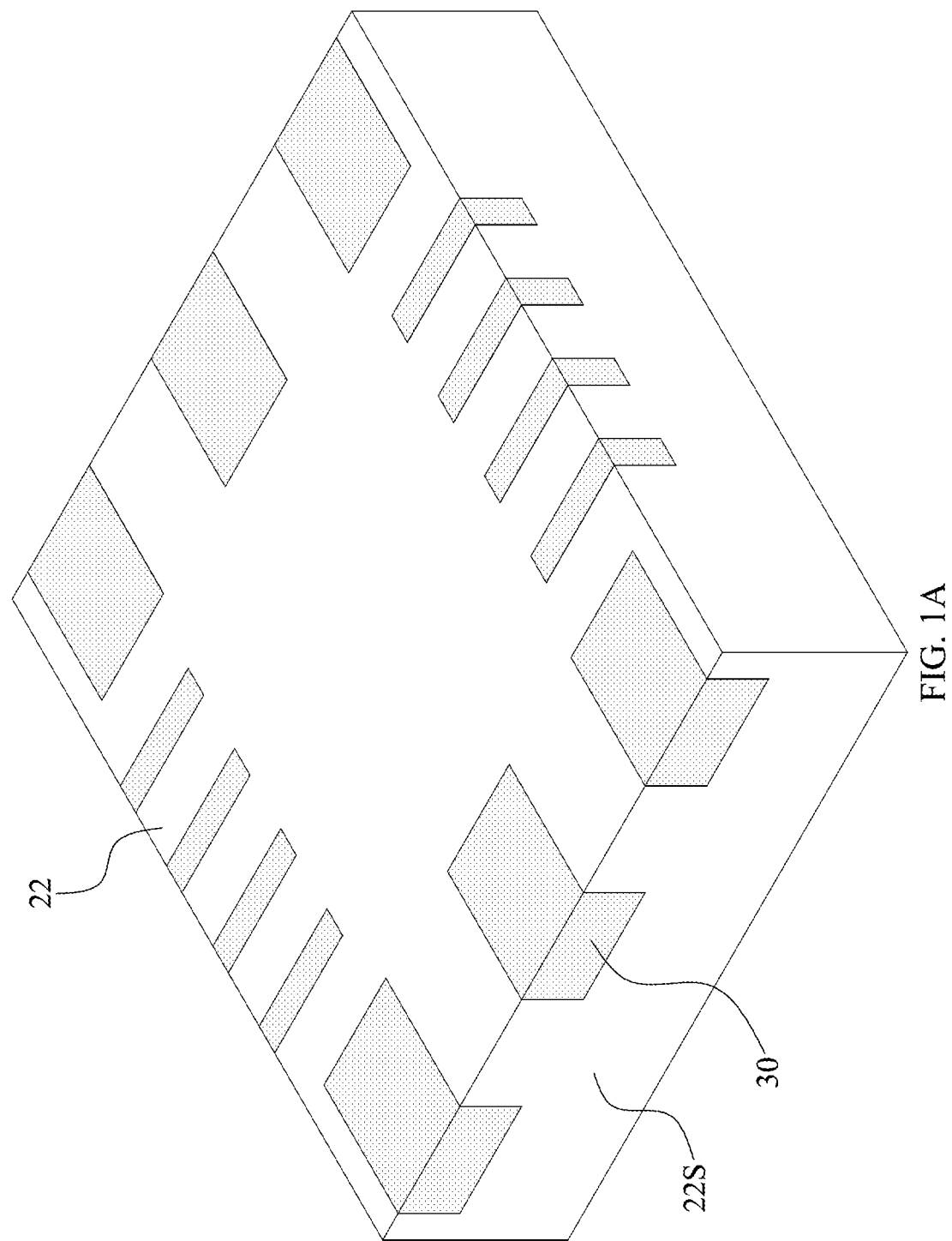
FIG. 1A is a schematic partial perspective view of an electronic package 1 in accordance with some embodiments of the present disclosure.

FIG. 1 is a schematic cross-sectional view of an electronic package 1 in accordance with some embodiments of the present disclosure, and FIG. 1A is a schematic partial perspective view of an electronic package 1 in accordance with some embodiments of the present disclosure. As shown in FIG. 1 and FIG. 1A, the electronic package 1 includes a substrate 10, a first encapsulant 20, wettable flanks (WF) 30 and a shielding layer 40. The substrate 10 includes a first surface 101, a second surface 102 opposite to the first surface 101 and a side surface 103 connecting the first surface 101 and the second surface 102. In some embodiments, the substrate 10 may include a wiring substrate or a circuit substrate having circuit layer 12 at least partially embedded in the substrate 10. The circuit layer 12 may include a substrate-level circuit layer, which is a low-density circuit layer with wider line width/line space (L/S). For example, the L/S of the circuit layer 12 may be equal to or greater than about 10 μm/about 10 μm. In some other embodiments, the substrate 10 may include a redistribution layer (RDL) or the like. The circuit layer 12 may include a bumping-level circuit layer, which is a high-density circuit layer with narrower L/S. For example, the L/S of the circuit layer 12 may be between about 2 μm/about 2 μm and about 10 μm/about 10 or less than about 2 μm/about 2 μm.

In some embodiments, the electronic package 1 may further include at least one first electronic component 14 disposed on the first surface 101 of the substrate 10. By way of examples, one first electronic component 14 may be electrically connected to the substrate 10 through solder bumps 14B in a flip chip manner, and/or another first electronic component 14 may be electrically connected to the substrate 10 through bonding wires 14W. In some embodiments, the electronic package 1 may further include at least one second electronic component 16 disposed on the second surface 102 of the substrate 10, and may be electrically connected to the substrate 10 through e.g., solder bumps 16B. The first electronic component 14 and the second electronic component 16 may be electrically connected to each other through the circuit layer 12 of the substrate 10.

The first encapsulant 20 is disposed on the first surface 101 of the substrate 10. The first encapsulant 20 may encapsulate the first electronic component(s) 14. The first encapsulant 20 may include molding compound such as epoxy-based material (e.g. FR4, electronic molding compounds), resin-based material (e.g. Bismaleimide-Triazine (BT)), ABF, polyimide) or other suitable molding materials. In some embodiments, the first encapsulant 20 may further include fillers such as silicon oxide fillers dispensed in the molding material.

The wettable flanks 30 are partially embedded in the substrate 10, and exposed from the side surface 103 of the substrate 10. In some embodiments, the wettable flanks 30 are disposed at an intersection between the second surface 102 and the side surface 103. The wettable flanks 30 are exposed terminal ends of the circuit layer 12, and can promote solder wetting for the formation of electrical conductors 72 such as solder balls. As shown in FIG. 1, the wettable flank 30 allows the electrical conductor 72 wetting and protruding out from the side surface 103 of the substrate 10, and thus the electrical conductor 72 is visible when viewing from the first surface 101. Accordingly, the wettable flank 30 enables optical inspection of the soldering, which can increase reliability and reduce cost. In some embodiments, the wettable flanks 30 are electrically conductive, and may include metal material such as copper or an alloy thereof. In some embodiments, an organic solderability preservative (OSP) treatment can be performed to form a wetting surface on the metal material. The wetting surface may prevent the wettable flanks 30 from being oxidized.

In some embodiments, the electronic package 1 may further include a second encapsulant 22 disposed on the second surface 102 of the substrate 10. The second encapsulant 22 may include the same material as first encapsulant 20, but is not limited thereto. The second encapsulant 22 may encapsulate the second electronic component 16. The second encapsulant 22 partially encapsulates the wettable flank 30, and a side surface 30S and/or a bottom surface 30B of the wettable flank 30 may be exposed from the second encapsulant 22. In some embodiments, the plurality of wettable flanks 30 may be arranged alternately with the second encapsulant 22, and exposed from a side surface 22S of the second encapsulant 22.

The shielding layer 40 may cover a side surface 20S of the first encapsulant 20. In some embodiments, the shielding layer 40 may cover all side surfaces 20S and an upper surface 20U of the first encapsulant 20. By way of example, the shielding layer 40 may directly contact all side surfaces 20S and the upper surface 20U of the first encapsulant 20. The shielding layer 40 may include a metal layer such as a copper layer or the like. In some embodiments, the electronic package 1 may further include a conductive pillar 42 disposed on the first surface 101 of the substrate 10 and between the side surface 20S and the shielding layer 40. The conductive pillar 42 may include a copper pillar or the like, and may be electrically connected to the circuit layer 12 of the substrate 10. The shielding layer 40 may be electrically connected to the circuit layer 12 through the conductive pillar 42. The shielding layer 40 may be configured to provide electromagnetic interference (EMI) shielding, and is grounded. By way of examples, the shielding layer 40 is electrically connected to a printed circuit board (PCB) 70 and grounded through the conductive pillar 42, a first group of the circuit layer 12, the wettable flanks 30 and the electrical conductors 72. On the other hand, the first electronic component 14 and the second electronic component 16 may be electrically connected to PCB 70 through a second group of the circuit layer 12, the wettable flanks 30 and the electrical conductors 72. The first group and second group of the circuit layer 12, the wettable flanks 30 and the electrical conductors 72 are electrically disconnected. Specifically, the shielding layer 40 is electrically connected to the first group of wettable flanks 30, but not electrically connected to the second group of wettable flanks 30. More specifically, the shielding layer 40 is electrically connected to the first group of wettable flanks 30 through the conductive pillar 42 and the circuit layer 12 embedded in the substrate 10. On the side surface 103 of the substrate 10, the shielding layer 40 is spaced apart from the wettable flanks 30. In some embodiments, the shielding layer 40 and the wettable flank 30 are separated by the side surface 103 of the substrate 10. By way of example, the substrate 10 includes a recession 10R1 between the first surface 101 and the side surface 103, and a portion of the shielding layer 40 and a portion of the conductive pillar 42 (if exists) are inserted into the recession 10R1 of the substrate 10. Accordingly, the shielding layer 40 may be recessed or substantially coplanar with the side surface 103 of the substrate 10. On the other hand, the substrate 10 may further include a another recession 10R2 between the second surface 102 and the side surface 103, and a portion of the wettable flank 30 may be inserted into the recession 10R2. Accordingly, the wettable flank 30 may be recessed or substantially coplanar with the side surface 103 of the substrate 10. By virtue of the above configuration, the shielding layer 40 and the wettable flank 30 can be separated by the side surface 103 of the substrate 10.

Figure 2A:
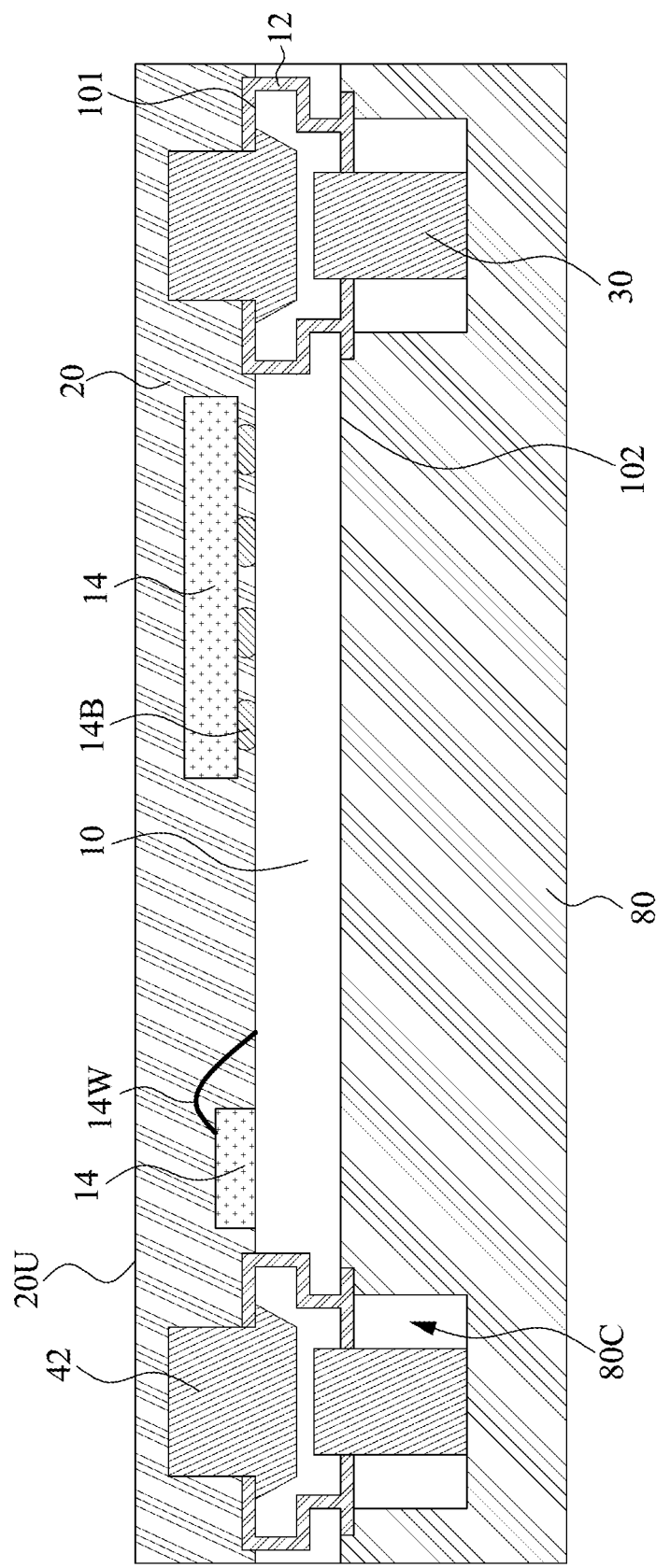
FIG. 2A, FIG. 2B, FIG. 2C, FIG. 2D and FIG. 2E illustrate operations of manufacturing an electronic package in accordance with some embodiments of the present disclosure.

FIG. 2A, FIG. 2B, FIG. 2C, FIG. 2D and FIG. 2E illustrate operations of manufacturing an electronic package in accordance with some embodiments of the present disclosure. As shown in FIG. 2A, a substrate 10 is provided. Circuit layer 12 and conductive pillars 42 may be formed on a first surface 101 of the substrate 10, and electrically connected to each other. Wettable flanks 30 may be formed on a second surface 102 of the substrate 10, and electrically connected to the circuit layer 12. In some embodiments, the wettable flanks 30 may be fabricated by forming a plurality of conductive pillars on the second surface 102 of the substrate 10. By way of example, the conductive pillars can be built up on the circuit layer 12 by electroplating, deposition or the like. In some embodiments, the substrate 10 is then held by a carrier 80 with cavities 80C, and the wettable flanks 30 are accommodated in the cavities 80C. First electronic component(s) 14 can be disposed on the first surface 101 of the substrate 10 and electrically connected to the circuit layer 12 is one or more manners such as by solder bumps 14B and/or by bonding wires 14W. A first encapsulant 20 may be formed on the first surface 101 of the substrate 10 to encapsulate the first electronic component(s) 14 and/or the conductive pillars 42. In some embodiments, the circuit layer 12, the conductive pillars 42, the wettable flanks 30, the first electronic component(s) 14 and the first encapsulant 20 may be formed on the substrate 10 before the substrate 10 is thinned.

Figure 2B:
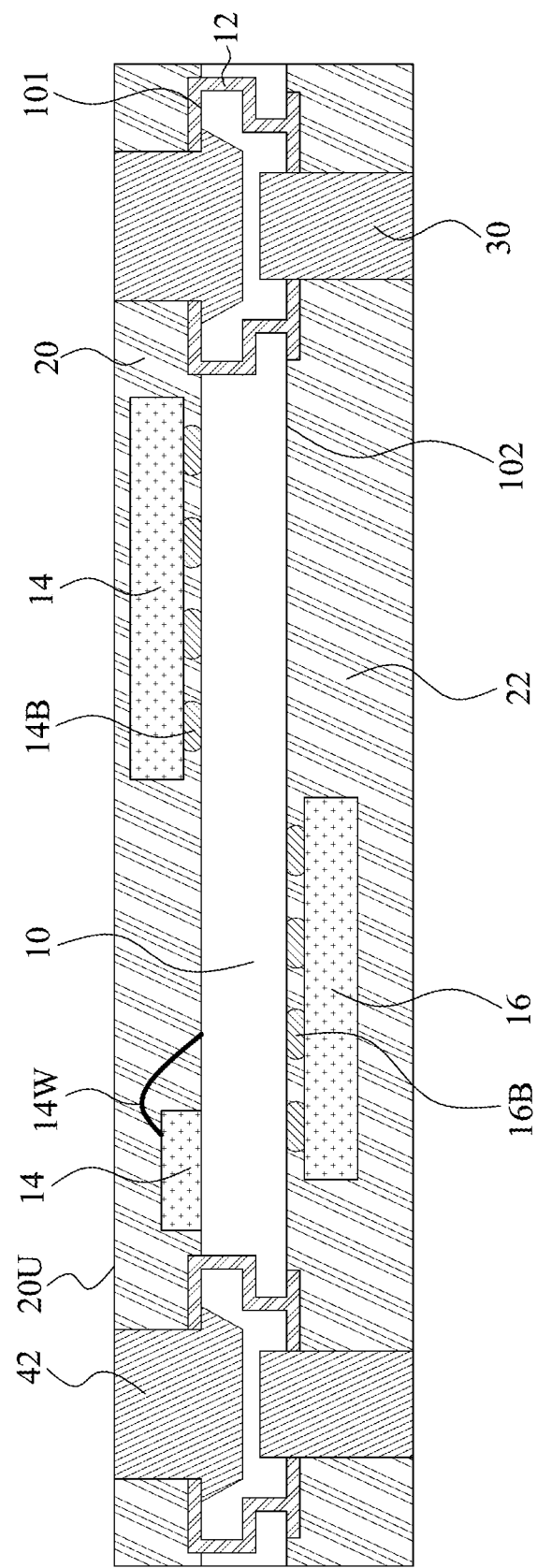

As shown in FIG. 2B, the first encapsulant 20 may be thinned by e.g., grinding to expose upper surfaces 42U of the conductive pillars 42. The carrier 80 may be removed from the second surface 102 of the substrate 10. At least one second electronic component 16 may be disposed on the second surface 102 of the substrate 10, and electrically connected to the substrate 10 through e.g., solder bumps 16B. In some embodiments, a second encapsulant 22 may be formed on the second surface 102 of the substrate 10 to encapsulate the second electronic component 16. The second encapsulant 22 may be thinned by e.g., grinding to expose bottom surfaces 30B of the wettable flank 30.

Figure 2C:
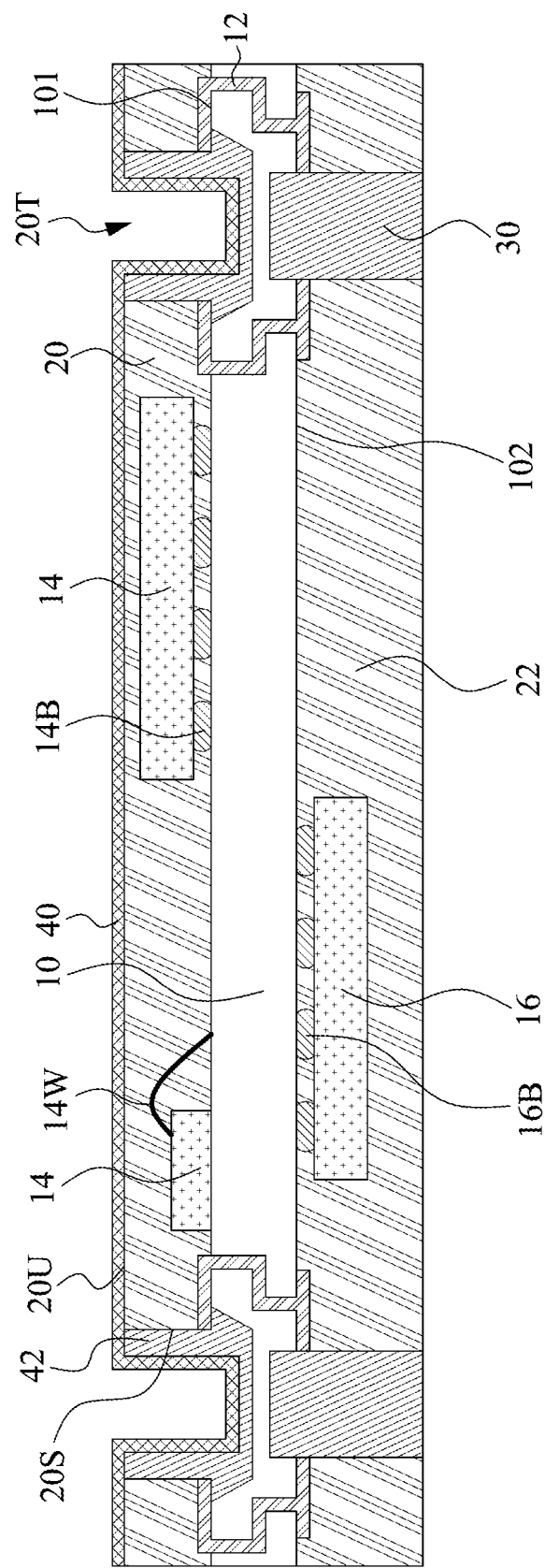

As shown in FIG. 2C, a first pre-cut process is performed to form a trench 20T in the first encapsulant 20 to expose a side surface 20S of the first encapsulant 20. In some embodiments, the pre-cut process is performed through the conductive pillar 40, and the trench 20T does not penetrate through the substrate 10 such that a bottom of the trench 20T is distant from the wettable flanks 30 by the substrate 10. In some embodiments, the bottom of trench 20T may stop at the first surface 101 of the substrate 10 during the first pre-cut process. Alternatively, a portion of the substrate 10 may be cut during the first pre-cut process. Subsequently, a shielding layer (e.g., a first shielding layer) 40 is formed to cover the side surface 20S and the upper surface 20U of the first encapsulant 20. For example, the shielding layer 40 may be in contact with and electrically connected to the conductive pillars 42.

Figure 2D:
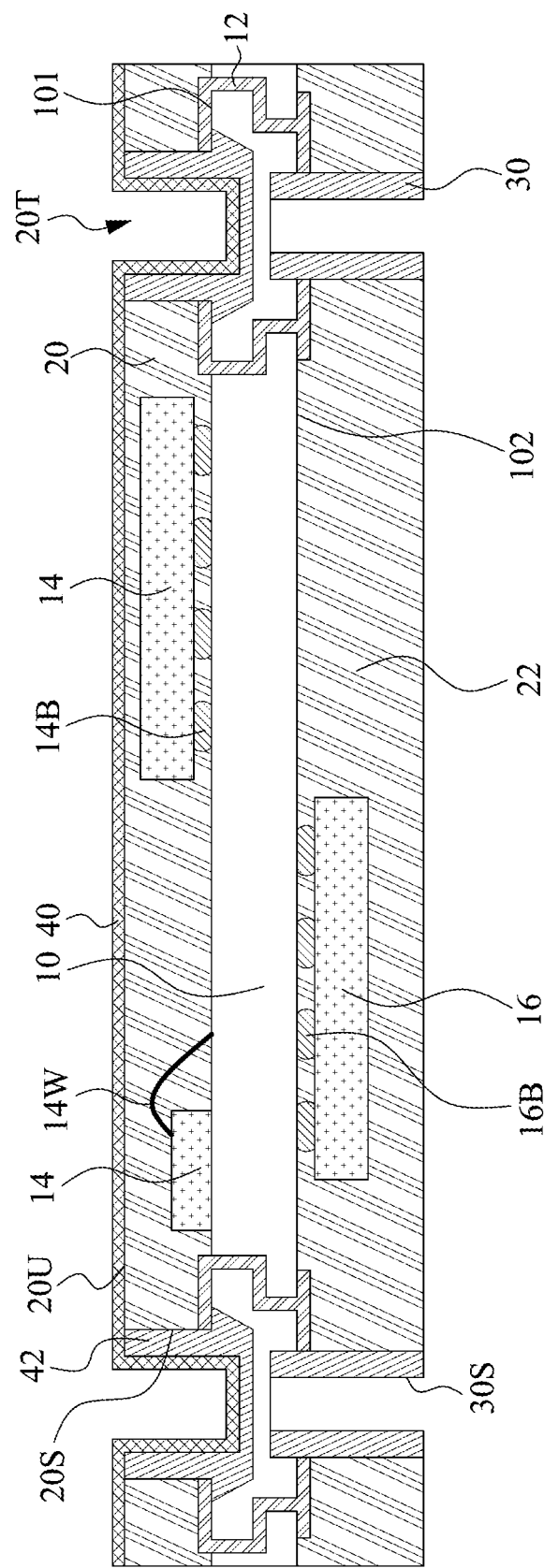

As shown in FIG. 2D, a second pre-cut process may be optionally performed to cut the wettable flanks 30 to expose side surfaces 30S of the wettable flanks 30. In some embodiments, an organic solderability preservative (OSP) treatment may be performed to form a wetting surface on the side surfaces 30S of the wettable flanks 30.

Figure 2E:
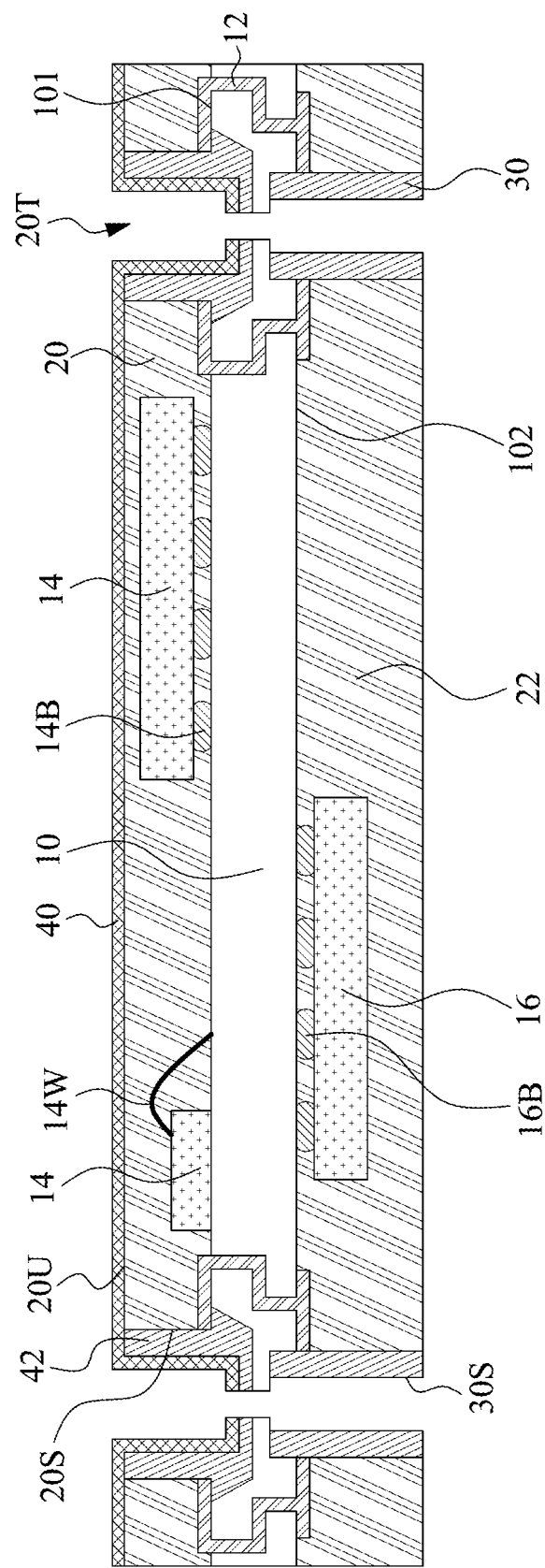

As shown in FIG. 2E, a singulation process is performed to singulate the wettable flanks 30, the substrate 10 and the shielding layer 40 subsequent to the second pre-cut process. The singulated substrate 10 may be then bonded to a PCB 70 by e.g., electrical conductors 72 to form the electronic package 1 as illustrated in FIG. 1.

The electronic packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 3:
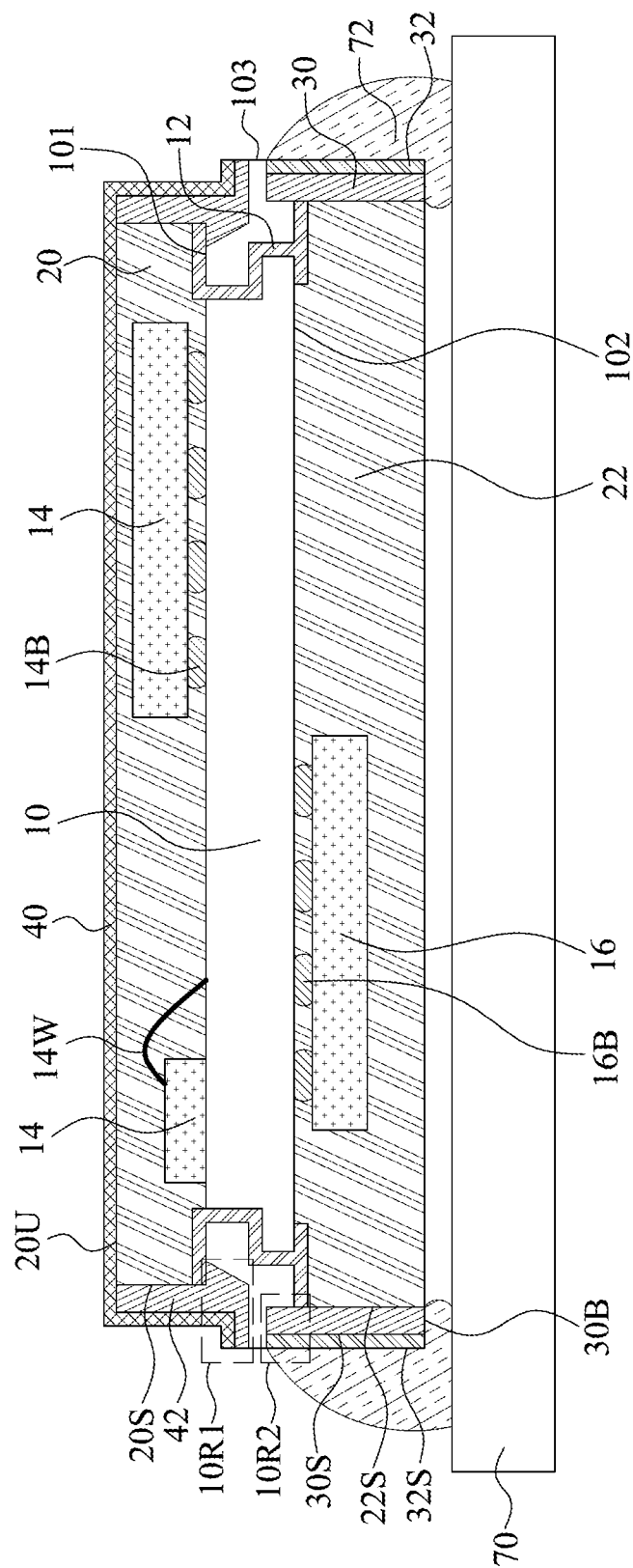
FIG. 3 is a schematic cross-sectional view of an electronic package in accordance with some embodiments of the present disclosure.

FIG. 3 is a schematic cross-sectional view of an electronic package 2 in accordance with some embodiments of the present disclosure. As shown in FIG. 3, in contrast to the electronic package 1 of FIG. 1, the electronic package 2 may further include a wetting layer 32 on the side surfaces 30S of the wettable flanks 30. The wetting layer 32 may, but is not limited to, further cover bottom surfaces 30B of the wettable flanks 30. By way of example, the wetting layer 32 may directly contact the side surfaces 30S of the wettable flanks 30, and may further directly contact the bottom surfaces 30B of the wettable flanks 30. The wetting layer 32 may enhance solder wetting of the electrical conductors 72. The wetting layer 32 may also be an anti-oxidization film configured to prevent the wettable flanks 30 from being oxidized. In some embodiments, the wetting layer 32 may include a solder material. In some embodiments, a side surface 32S of the wetting layer 32 and the side surface 103 of the substrate 10 may be substantially coplanar.

Figure 4A:
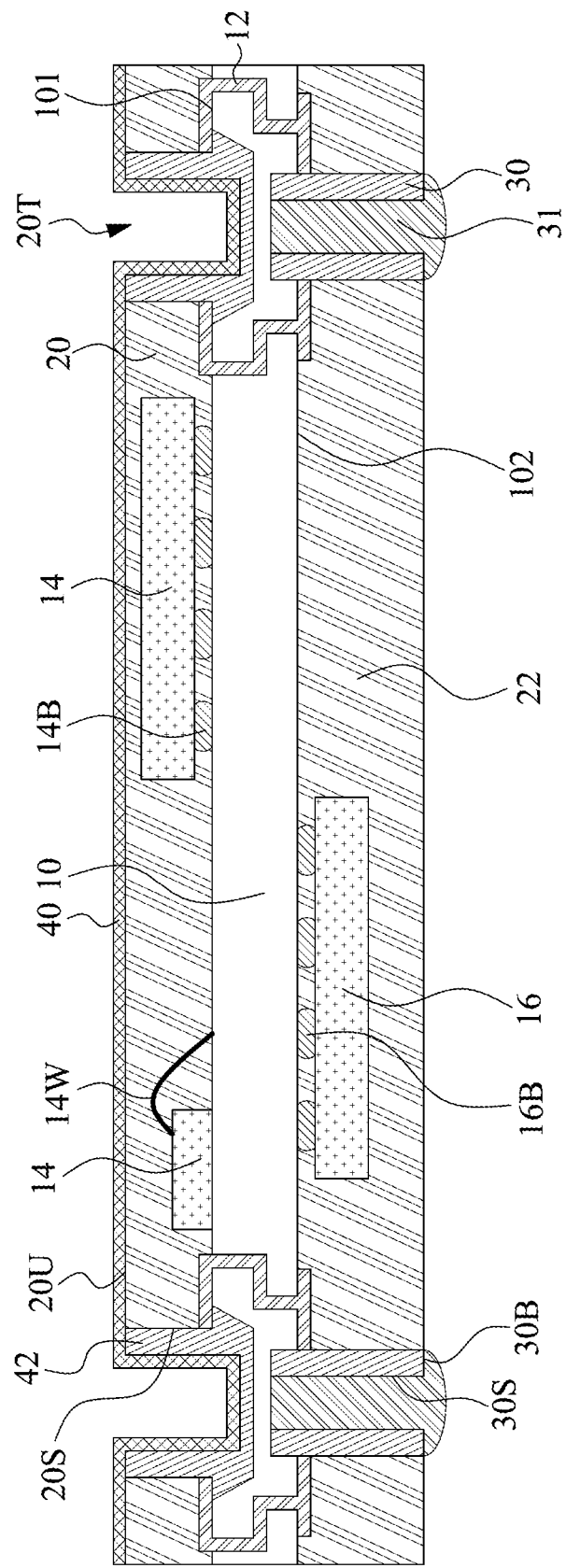
FIG. 4A and FIG. 4B illustrate operations of manufacturing an electronic package in accordance with some embodiments of the present disclosure.
Figure 4B:
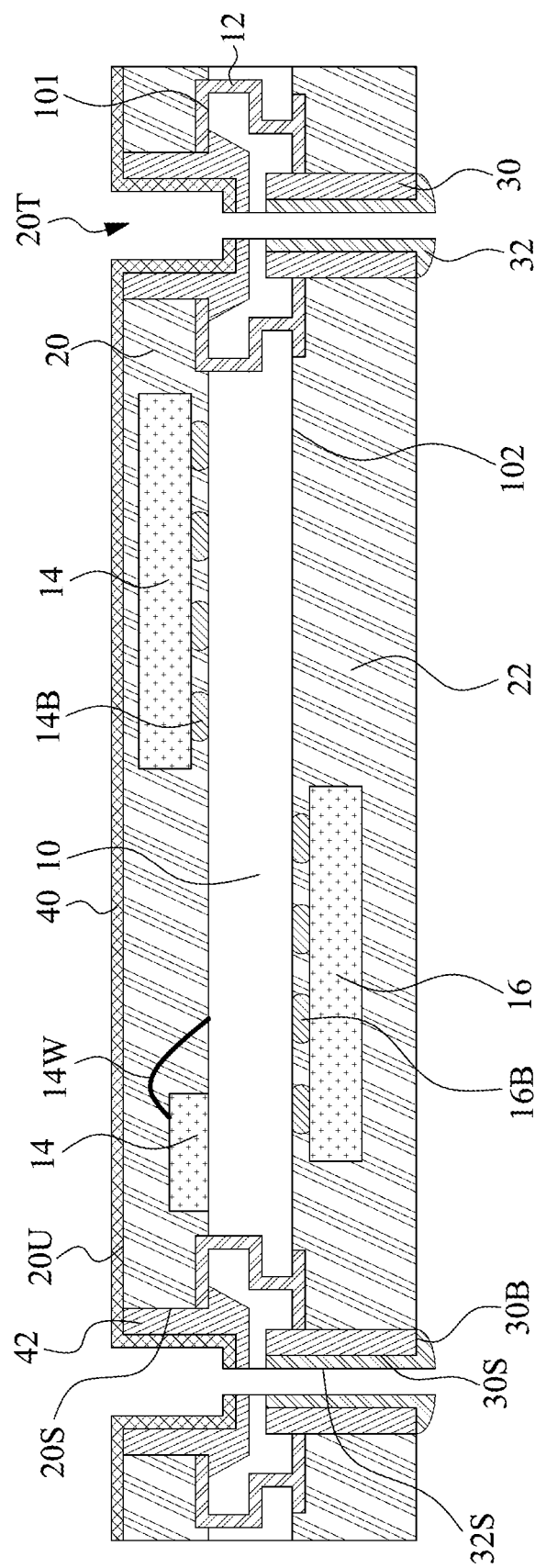

FIG. 4A and FIG. 4B illustrate operations of manufacturing an electronic package in accordance with some embodiments of the present disclosure. The manufacturing operations of FIG. 4A may be performed subsequent to the manufacturing operations of FIG. 2D. As shown in FIG. 4A, a wetting material 31 such as a solder material may be formed on the side surfaces 30S and the bottom surfaces 30B of the wetting flanks 30 after the second pre-cut process. As shown in FIG. 4B, a singulation process is performed to singulate the wettable flanks 30, the substrate 10 and the shielding layer 40. The singulated substrate 10 may be then bonded to a PCB 70 by e.g., electrical conductors 72 to form the electronic package 2 as illustrated in FIG. 3.

Figure 5:
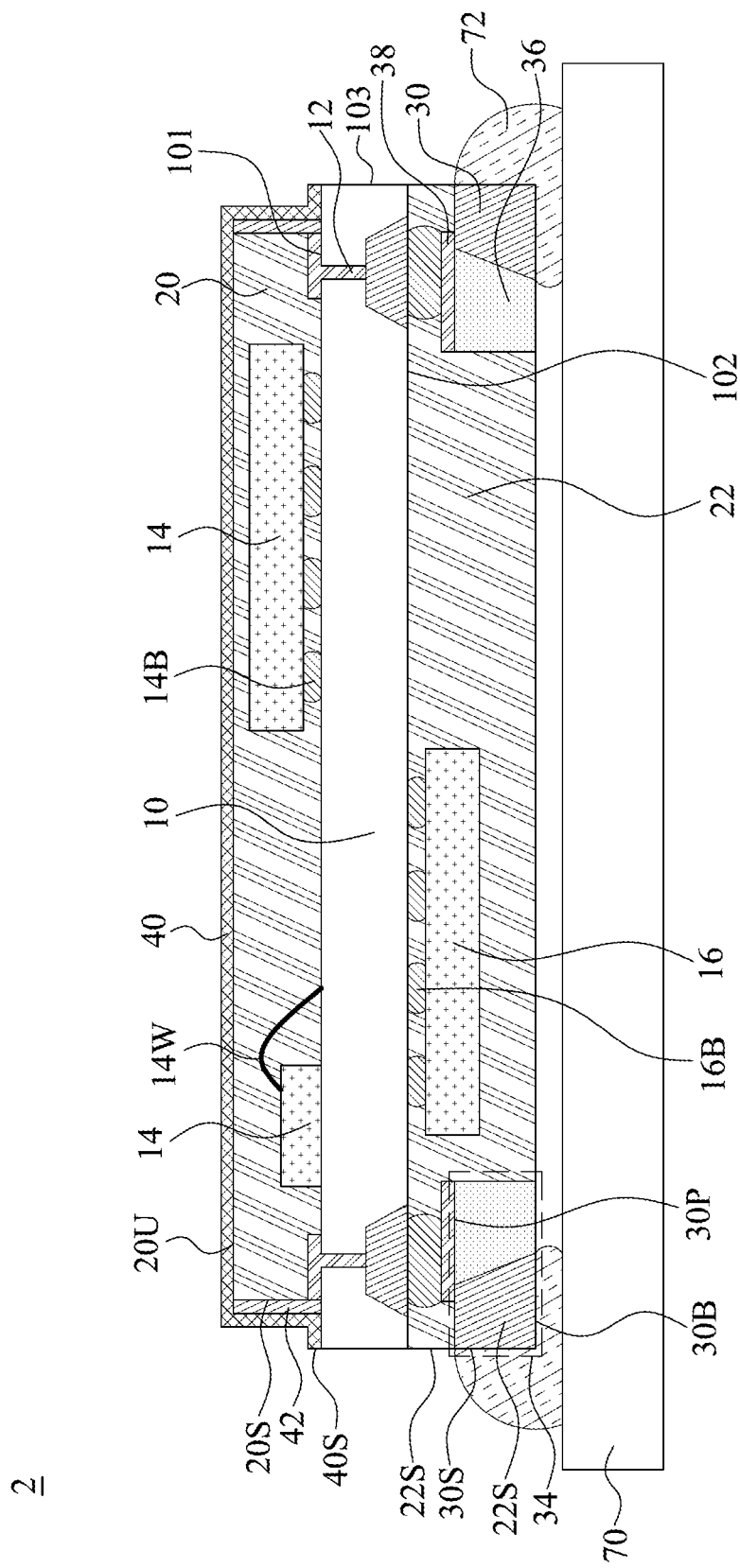
FIG. 5 is a schematic cross-sectional view of an electronic package 3 in accordance with some embodiments of the present disclosure.

FIG. 5 is a schematic cross-sectional view of an electronic package 3 in accordance with some embodiments of the present disclosure. As shown in FIG. 5, in contrast to the electronic package 1 of FIG. 1, the electronic package 3 further includes interposers 34 disposed on the second surface 102 of the substrate 10. Each of the interposers 34 may include the wettable flank 30 and an insulation layer 36 connecting the wettable flank 30, and landing pad(s) 30P on the insulation layer 36 and electrically connecting the wettable flank 30. In some embodiments, the interposers 34 are pre-formed, and then bonded to the second surface 102 by electrical conductors 38 such as solder bumps or solder balls. In some embodiments, a portion of the shielding layer 40, a portion of the side surface 103 of the substrate 10 and a side surface 30S of the wettable flank 30 may be substantially coplanar. In some embodiments, a side surface 40S of the shielding layer 40, the side surface 103 of the substrate 10, the side surface 30S of the wettable flank, a side surface 22S of the second encapsulant 22 and/or a side surface 42S of the conductive pillar 42 may be substantially coplanar.

Figure 6A:
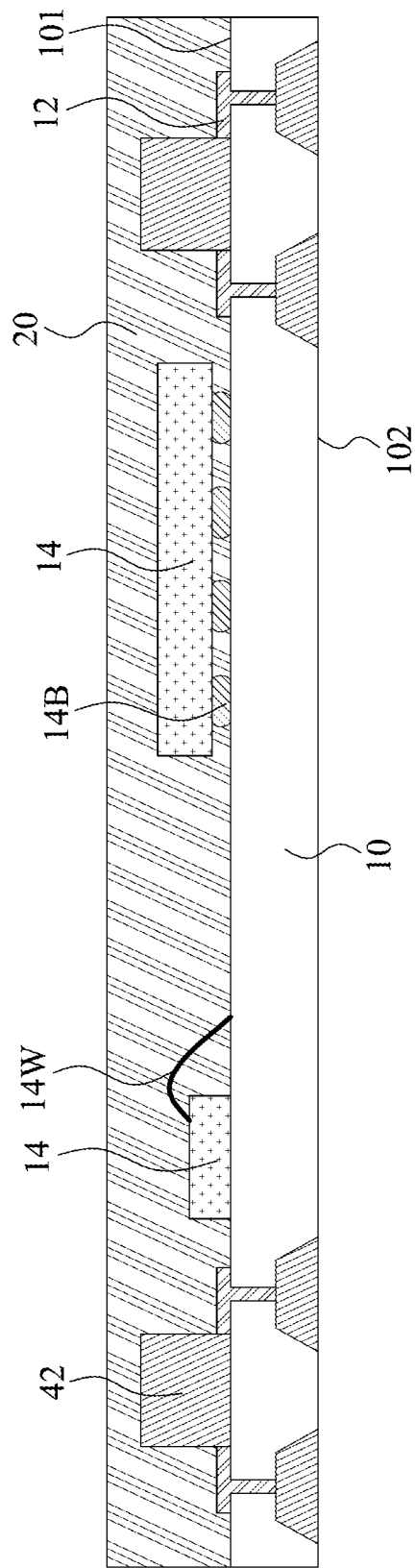
FIG. 6A, FIG. 6B, FIG. 6C, FIG. 6D and FIG. 6E illustrate operations of manufacturing an electronic package in accordance with some embodiments of the present disclosure.

FIG. 6A, FIG. 6B, FIG. 6C, FIG. 6D and FIG. 6E illustrate operations of manufacturing an electronic package in accordance with some embodiments of the present disclosure. As shown in FIG. 6A, a substrate 10 is provided. Circuit layer 12 and conductive pillars 42 may be formed on a first surface 101 of the substrate 10, and electrically connected to each other. First electronic component(s) 14 can be disposed on the first surface 101 of the substrate 10 and electrically connected to the circuit layer 12 is one or more manners such as by solder bumps 14B and/or by bonding wires 14W. A first encapsulant 20 may be formed on the first surface 101 of the substrate 10 to encapsulate the first electronic component(s) 14 and/or the conductive pillars 42.

Figure 6B:
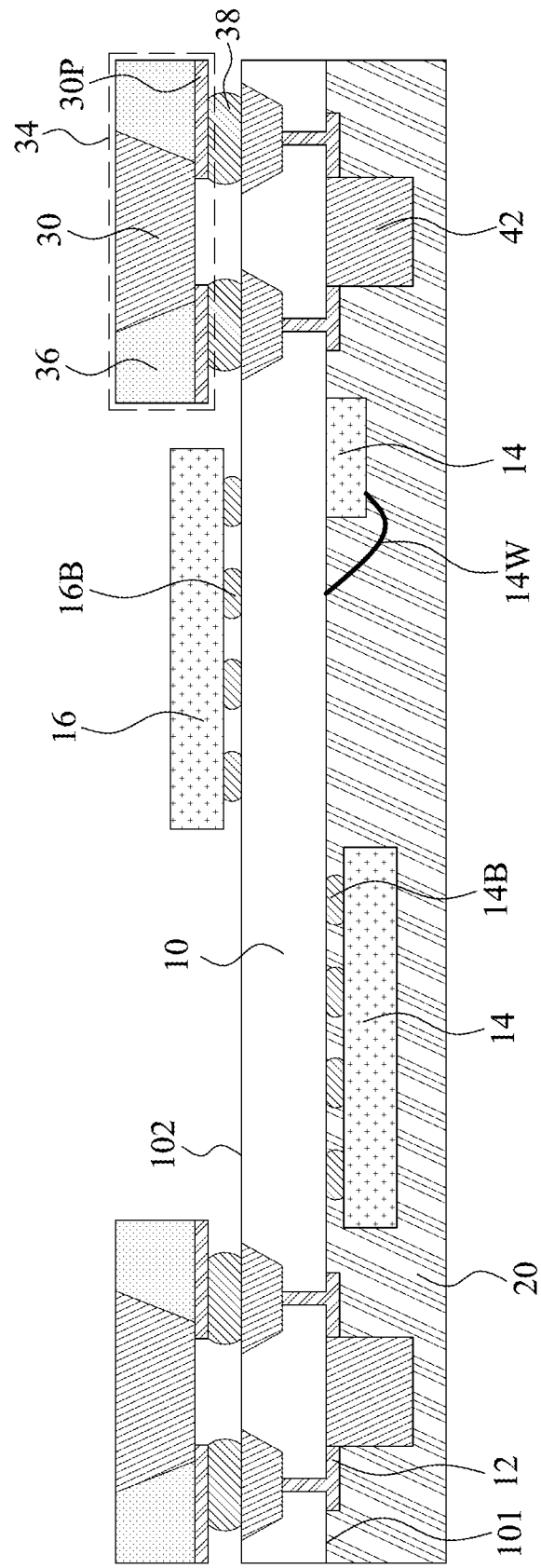

As shown in FIG. 6B, interposers 34 are provided and disposed on the second surface 102 of the substrate 10. In some embodiments, each of the interposers 34 may include one or more wettable flanks 30 and an insulation layer 36 connecting the wettable flank(s) 30. In some embodiments, the interposers 34 may include semiconductor interposers such as silicon interposers and can be pre-formed by e.g., semiconductor process. The interposers 34 can then be bonded to the second surface 102 by electrical conductors 38 such as solder bumps or solder balls. At least one second electronic component 16 may be disposed on the second surface 102 of the substrate 10, and electrically connected to the substrate 10 through e.g., solder bumps 16B. The second electronic component 16 may be bonded to the substrate prior to or subsequent to the interposers 34 are bonded on the substrate 10.

Figure 6C:
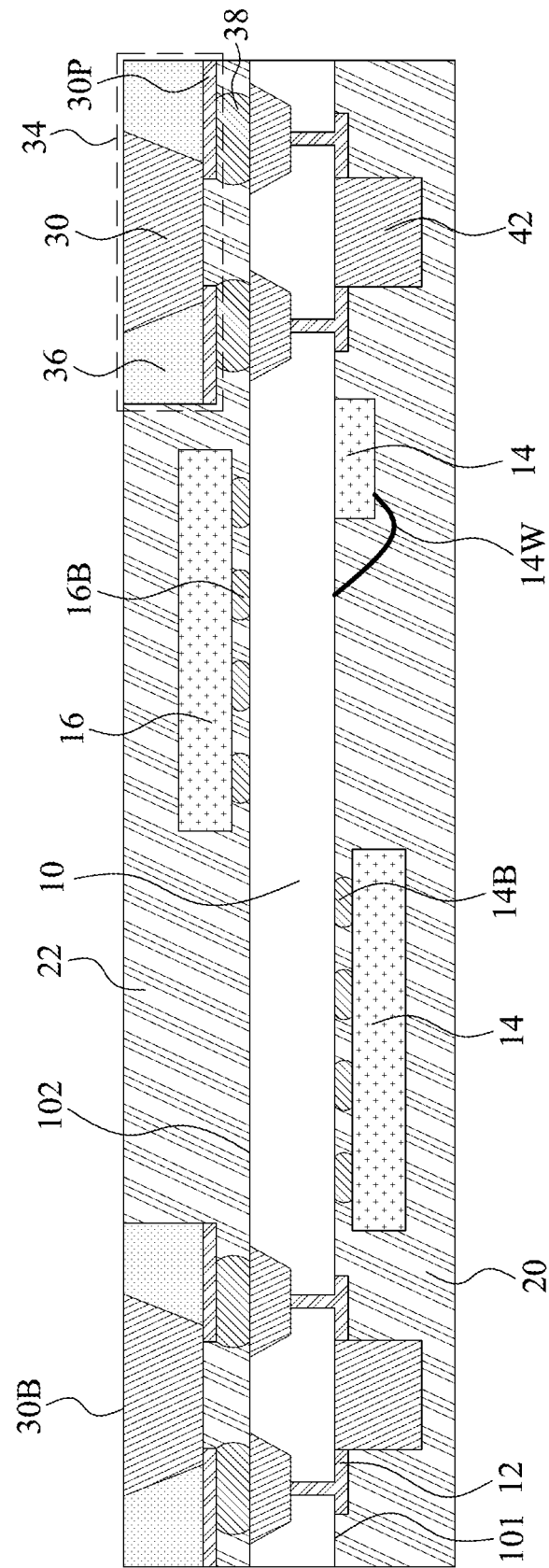

As shown in FIG. 6C, a second encapsulant 22 may be formed on the second surface 102 of the substrate 10 to encapsulate the second electronic component 16 and the interposers 34. The second encapsulant 22 may be thinned by e.g., grinding to expose bottom surfaces 30B of the wettable flank 30.

Figure 6D:
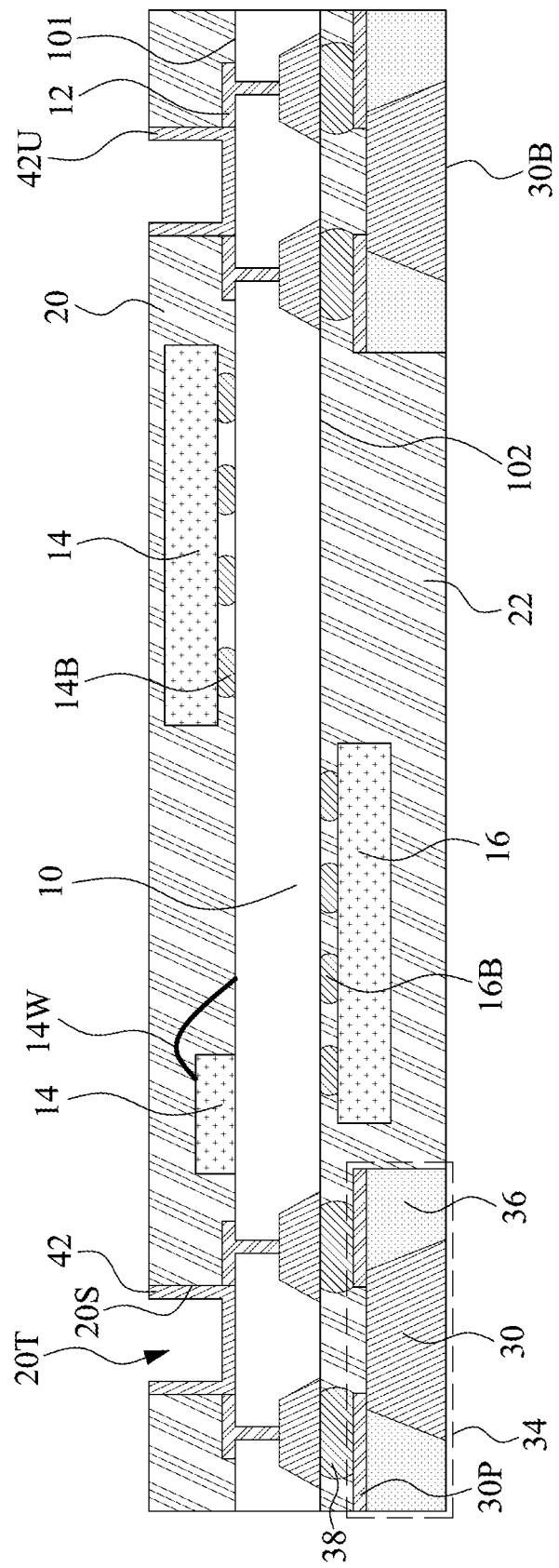

As shown in FIG. 6D, the substrate 10 may be flipped over, and the first encapsulant 20 may be thinned by e.g., grinding to expose upper surfaces 42U of the conductive pillars 42. Subsequently, a first pre-cut process is performed to form a trench 20T in the first encapsulant 20 to expose a side surface 20S of the first encapsulant 20. In some embodiments, the pre-cut process is performed through the conductive pillar 40, and the trench 20T does not penetrate through the conductive pillar 40. Subsequently, a shielding layer 40 is formed to cover the side surface 20S and the upper surface 20U of the first encapsulant 20. For example, the shielding layer 40 may be in contact with and electrically connected to the conductive pillars 42.

Figure 6E:
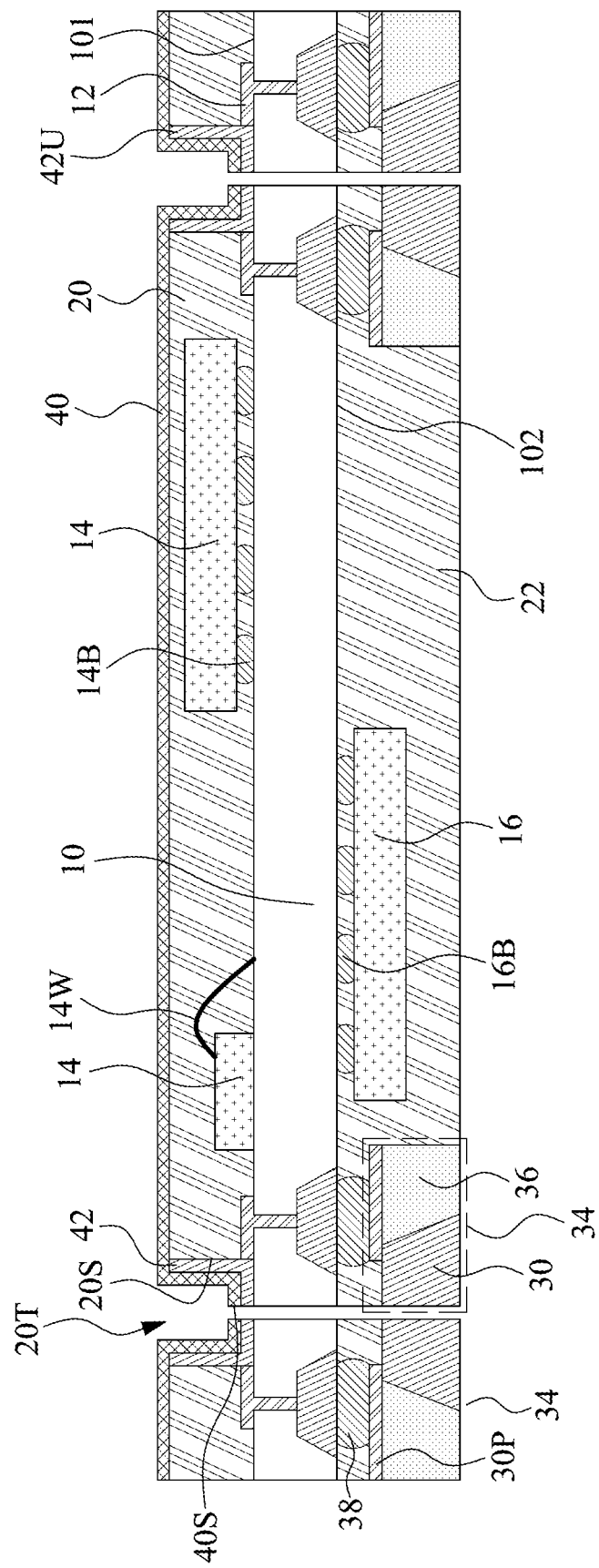

As shown in FIG. 6E, a singulation process is performed to singulate the wettable flanks 30 of the interposers 34, the substrate 10 and the shielding layer 40. The singulated substrate 10 may be then bonded to a PCB 70 by e.g., electrical conductors 72 to form the electronic package 3 as illustrated in FIG. 5.

Figure 7:
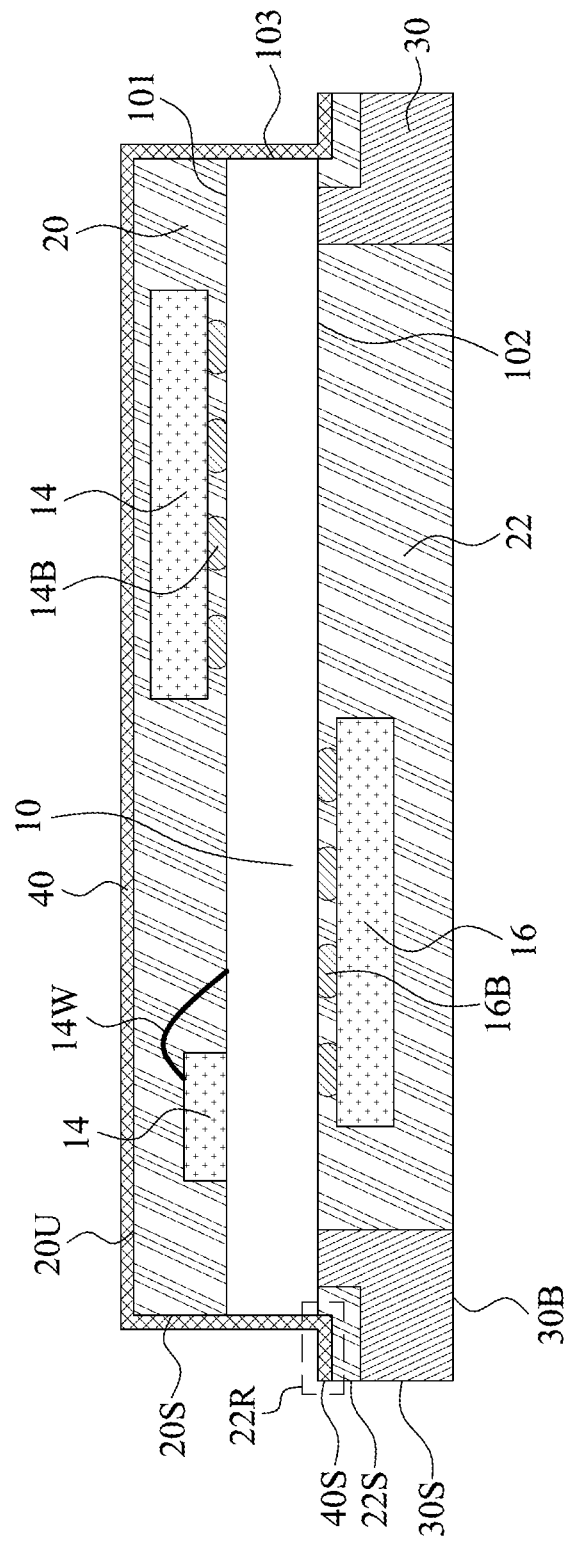
FIG. 7 is a schematic cross-sectional view of an electronic package in accordance with some embodiments of the present disclosure.

FIG. 7 is a schematic cross-sectional view of an electronic package 4 in accordance with some embodiments of the present disclosure. As shown in FIG. 7, in contrast of the electronic package 1 of FIG. 1, the conductive pillar 42 may be omitted, but is not limited thereto. The side surface 30S of the wettable flank 30 is exposed from a side surface 22S of the second encapsulant 22. The shielding layer 40 covers a side surface 20S of the first encapsulant 20 and at least a portion of the side surface 103 of the substrate 10. The shielding layer 40 and the wettable flank 30 are separated by the side surface 22S of the second encapsulant 22. The shielding layer 40 may be electrically connected to one of the wettable flank 30 through circuit layer (not shown) embedded in the substrate 10. In some embodiments, the second encapsulant 22 includes a recession 22R between the side surface 22S of the second encapsulant 22 and the side surface 103 of the substrate 10, and a portion of the shielding layer 40 may be inserted into the recession 22R. In some embodiments, a side surface 40S of the shielding layer 40, the side surface 22S of the second encapsulant 22 and the side surface 30S of the wettable flank 30 may be substantially coplanar. The material of the wettable flank 30 may include metal such as copper or the like. In some embodiments, the wettable flank 30 may include a rectangular cross-sectional shape.

Figure 8:
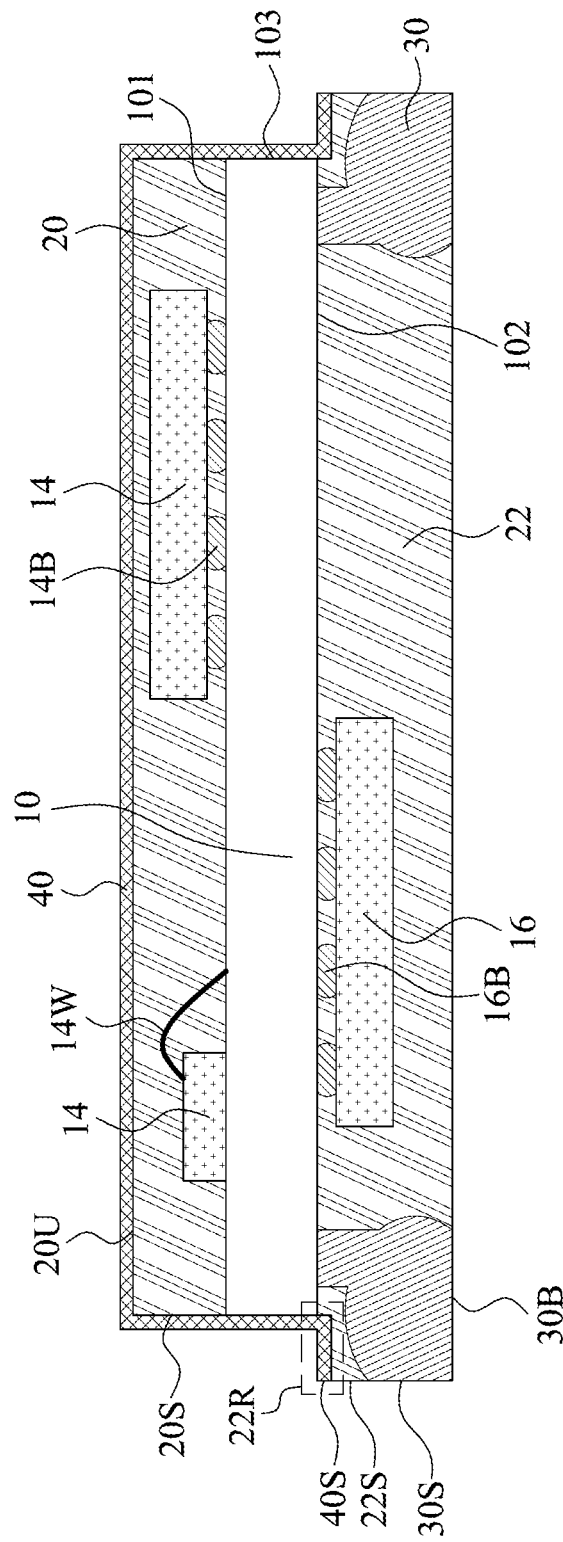
FIG. 8 is a schematic cross-sectional view of an electronic package in accordance with some embodiments of the present disclosure.

FIG. 8 is a schematic cross-sectional view of an electronic package 5 in accordance with some embodiments of the present disclosure. As shown in FIG. 8, in contrast of the electronic package 4 of FIG. 7, the wettable flank 30 may include a curved cross-sectional shape. The material of the wettable flank 30 may include solder material or the like.

Figure 9:
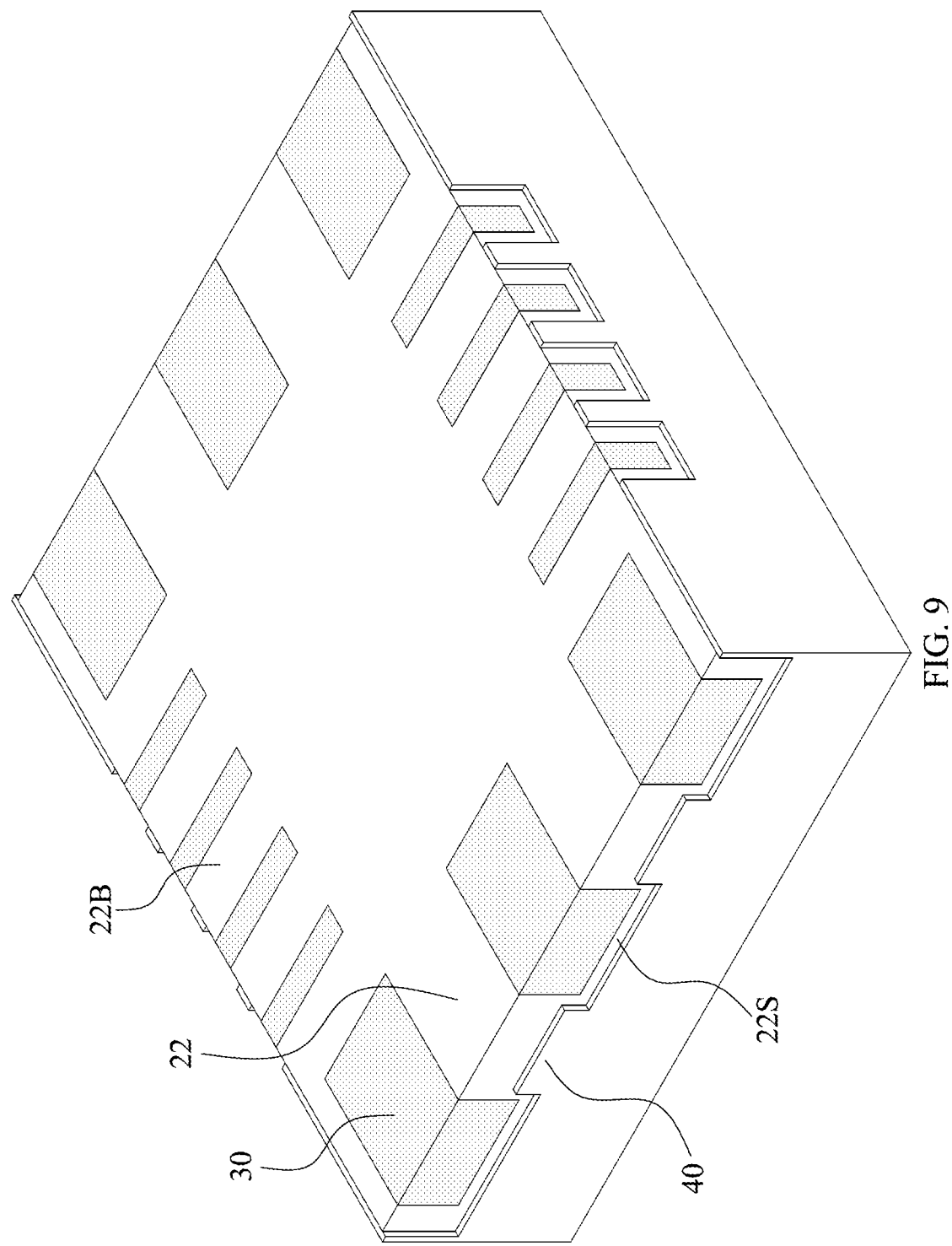
FIG. 9 is a schematic perspective view of an electronic package in accordance with some embodiments of the present disclosure.

FIG. 9 is a schematic perspective view of an electronic package 6 in accordance with some embodiments of the present disclosure. As shown in FIG. 9, in contrast of the electronic package 1 of FIG. 1A, the shielding layer 40 may further extend to the side surface 22S of the second encapsulant 22. The shielding layer 40 and the wettable flanks 30 may be separated by the side surface 22S of the second encapsulant 22. In some embodiments, the extension portion of the shielding layer 40 (e.g., a second shielding layer) covering the side surface 22S of the second encapsulant 22 may be formed subsequent to the formation of the shielding layer 40 (e.g., a first shielding layer) covering the first encapsulant 20. By way of example, the second shielding layer may be formed by the following processes. A portion of the second encapsulant 22 and the wettable flanks 30 may be blocked by e.g., a tape. The second shielding layer may be then formed on another portion of the second encapsulant 22 exposed from the tape. The tape is then removed to form the electronic package 6. By way of another example, the second shielding layer may be formed by the following processes. The second shielding layer can be formed on the second encapsulant 22 and the wettable flanks 30. A patterning process such as a laser patterning process can be performed to expose the wettable flanks 30 to form the electronic package 6.

Figure 10:
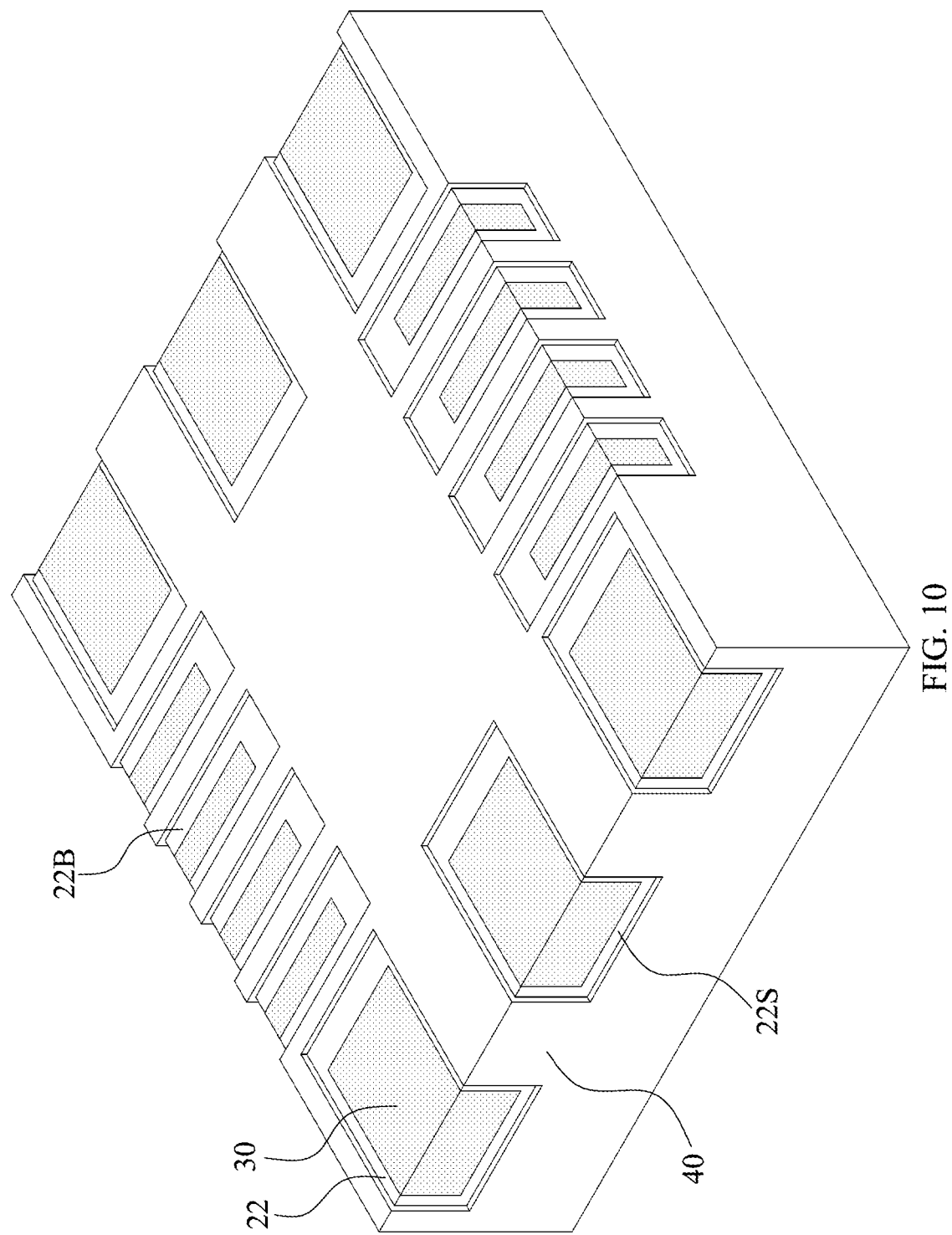
FIG. 10 is a schematic perspective view of an electronic package in accordance with some embodiments of the present disclosure.

FIG. 10 is a schematic perspective view of an electronic package 7 in accordance with some embodiments of the present disclosure. As shown in FIG. 10, in contrast of the electronic package 6 of FIG. 9, the shielding layer 40 may further cover a bottom surface 22B of the second encapsulant 22. The shielding layer 40 of the electronic package 7 may be formed in a manner similar to the electronic package 6.

In some embodiments of the present disclosure, the electronic package includes a shielding layer and wettable flanks. The shielding layer and the wettable flanks are both exposed from a side surface of the substrate, and the shielding layer and the wettable flanks are spaced apart. With the shielding layer and the wettable flanks, the electronic package is protected from EMI, and optical inspection can be performed to inspect the electrical connection between the substrate and a PCB. Accordingly, the reliability of the electronic package is improved. The electronic package of the present disclosure is suitable for various applications such as automotive components which requires high EMI shielding ability and high reliability.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic package, comprising:
   a substrate including a first surface, a second surface opposite to the first surface and a side surface connecting the first surface and the second surface;
   a first encapsulant disposed on the first surface of the substrate;
   a second encapsulant disposed on the second surface of the substrate;
   a wettable flank, wherein a side surface of the wettable flank is exposed from a side surface of the second encapsulant; and
   a shielding layer covering a side surface of the first encapsulant, wherein the shielding layer and the wettable flank are separated by the side surface of the second encapsulant.

2. The electronic package according to claim 1, wherein the side surface of the second encapsulant and the side surface of the wettable flank are substantially coplanar.

3. The electronic package according to claim 2, wherein the shielding layer and the wettable flank are separated by the side surface of the substrate that connects the first and the second surfaces.

4. The electronic package according to claim 3, further comprising an interposer disposed over the second surface of the substrate, wherein the interposer comprises the wettable flank and an insulation layer connecting the wettable flank.

5. The electronic package according to claim 4, wherein the interposer is bonded to the second surface of the substrate by an electrical connector.

6. The electronic package according to claim 4, wherein the interposer further comprises a landing pad arranged on the insulation layer and electrically connecting the wettable flank.

7. The electronic package according to claim 2, wherein the second encapsulant partially encapsulates the wettable flank, and a side surface and a bottom surface of the wettable flank are exposed from the second encapsulant.

8. The electronic package according to claim 7, wherein a side surface of the shielding layer, the side surface of the substrate, the side surface of the wettable flank and a side surface of the second encapsulant are substantially coplanar.

9. An electronic package, comprising:
   a substrate including a first surface, a second surface opposite to the first surface and a side surface connecting the first surface and the second surface;
   a first encapsulant disposed on the first surface of the substrate;
   an interposer disposed over the second surface of the substrate, wherein the interposer comprises a wettable flank that exposes from the side surface of the substrate and an insulation layer that connects the wettable flank; and
   a shielding layer covering a side surface of the first encapsulant, wherein on the side surface of the substrate, the shielding layer is spaced apart from the wettable flank.

10. The electronic package according to claim 9, wherein the interposer is bonded to the second surface of the substrate by an electrical connector.

11. The electronic package according to claim 10, wherein the interposer further comprises a landing pad arranged on the insulation layer and electrically connecting the wettable flank.

12. The electronic package according to claim 11, wherein the second encapsulant partially encapsulates the wettable flank, and a side surface and a bottom surface of the wettable flank are exposed from the second encapsulant.

13. The electronic package according to claim 12, wherein a side surface of the shielding layer, the side surface of the substrate, the side surface of the wettable flank and a side surface of the second encapsulant are substantially coplanar.

* * * * *

UNITED STATES PATENT AND TRADEMARK OFFICE
CERTIFICATE OF CORRECTION

PATENT NO. : 11,462,484 B2
APPLICATION NO. : 17/066408
DATED : October 4, 2022
INVENTOR(S) : You-Lung Yen, Bernd Karl Appelt and Kay Stefan Essig Page 1 of 1

It is certified that error appears in the above-identified patent and that said Letters Patent is hereby corrected as shown below:

On the Title Page

The Inventor information should read as follows:
(72) Inventors: You-Lung Yen, Kaohsiung (TW);
 Bernd Karl Appelt, Kaohsiung (TW);
 Kay Stefan Essig, Kaohsiung (TW)

Signed and Sealed this
Twenty-seventh Day of February, 2024

Katherine Kelly Vidal
*Director of the United States Patent and Trademark Office*